(12) United States Patent
Itri (10) Patent No.: US 7,580,494 B2
(45) Date of Patent: Aug. 25, 2009

(54) LOW WANDER TIMING GENERATION AND RECOVERY

(75) Inventor: Benedict A. Itri, Irvine, CA (US)

(73) Assignee: Positron Access Solutions, Inc., Irvine, CA (US)

( * ) Notice: Subject to any disclaimer, the term of this patent is extended or adjusted under 35 U.S.C. 154(b) by 0 days.

(21) Appl. No.: 12/173,005

(22) Filed: Jul. 14, 2008

(65) Prior Publication Data

US 2008/0267337 A1    Oct. 30, 2008

Related U.S. Application Data

(63) Continuation of application No. 10/781,270, filed on Feb. 17, 2004, now Pat. No. 7,415,092.

(60) Provisional application No. 60/530,055, filed on Dec. 15, 2003.

(51) Int. Cl.
*H04L 7/00* (2006.01)
*H04L 25/00* (2006.01)

(52) U.S. Cl. ................... 375/355; 375/259; 375/354

(58) Field of Classification Search ............ 375/219, 375/259, 295, 354, 355, 356, 373, 376; 327/2, 327/3, 7, 156; 331/1 A, 1 R, 18, 25
See application file for complete search history.

(56) References Cited

U.S. PATENT DOCUMENTS

| | | | |
|---|---|---|---|
| 5,062,124 A * | 10/1991 | Hayashi et al. | 375/356 |
| 5,256,980 A * | 10/1993 | Itri | 327/105 |
| 5,790,608 A * | 8/1998 | Benayoun et al. | 375/356 |
| 5,864,592 A * | 1/1999 | Itri | 375/375 |
| 6,351,485 B1 | 2/2002 | Soe et al. | |
| 6,377,647 B1 * | 4/2002 | Kaku et al. | 375/376 |
| 7,415,092 B2 * | 8/2008 | Itri | 375/376 |
| 2003/0043945 A1 | 3/2003 | Mujica et al. | |

* cited by examiner

*Primary Examiner*—Betsy L Deppe (57) ABSTRACT

Systems, apparatuses, and methods for low wander timing generation and/or recovery are disclosed here. In one aspect, embodiments of the present disclosure include a communication system for high speed communications between a first location and a second location. The communication system, may include a transmitter module at the first location associated a first clock and/or a receiver module at the second location associated with the second clock.

18 Claims, 8 Drawing Sheets

LOW WANDER TIMING GENERATION AND RECOVERY

CROSS-REFERENCE TO RELATED APPLICATIONS

This application is a continuation of U.S. patent application Ser. No. 10/781,270 filed Feb. 17, 2004 entitled "LOW WANDER TIMING GENERATION AND RECOVERY" by Benedict A. Itri, now U.S. Pat. No. 7,415,092 issued on Aug. 19, 2008, which claims the benefit of U.S. Provisional Patent Application No. 60/530,055 filed Dec. 15, 2003, entitled, "LOW WANDER TIMING GENERATION AND RECOVERY," by Benedict A. Itri, and which is hereby incorporated by reference in its entirety.

BACKGROUND OF INVENTION

1. Field of Invention

The present invention relates to communications and more particularly to circuits and methods for providing low wander timing generation and recovery.

2. Description of Related Art

Synchronizing modulation and demodulation frequencies is made difficult by the physical separation of communication devices where each device is conceivably driven by its own local clock. Take for example, current asymmetrical digital subscriber line (ADSL) systems. Current ADSL systems operate according to Discrete Multitone (DMT) frequency multiplexing where generally the central office (CO) modem generates this master clock signal. All corresponding client modems must recover the master clock signal from downstream data for processing such as sampling, demodulation, and transmission of upstream data. While modern clocks can be manufactured with considerable accuracy, difficulties in locking remote clocks and minute differences in manufacture and calibration has to date prevented the manufacture of a high-speed modem of the highest possible performance.

Figure 1:
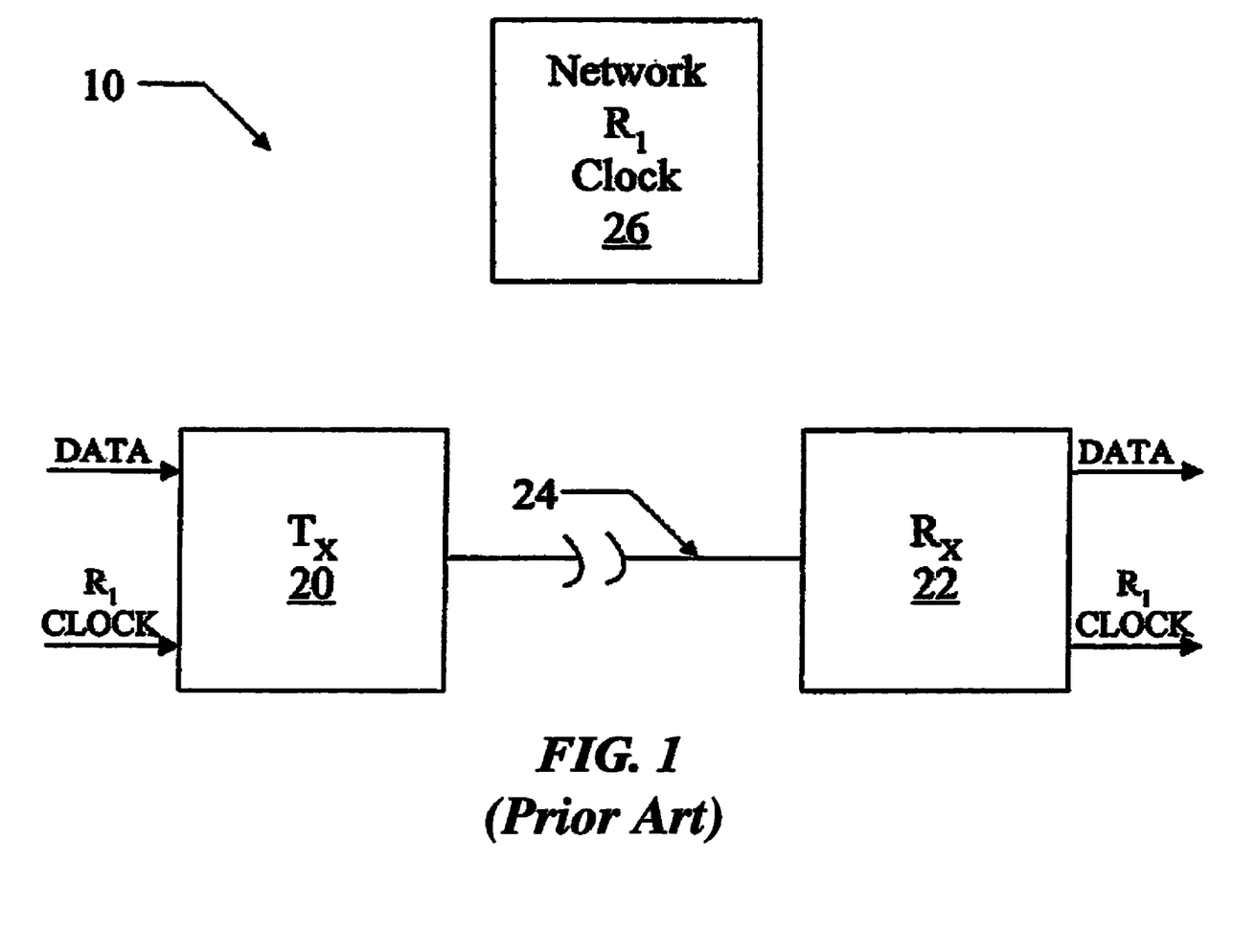
FIG. 1 illustrates a communication system of the prior art.

Prior Art FIG. 1 is a block diagram of a communications system 10 including a transmitter 20, a receiver 22, a network 24 bi-directionally coupling the transmitter 20 and the receiver 22, and a network link clock 26. The communications system 10 illustrates one possible solution to the synchronization problem described above. In the communications system 10, both the transmitter 20 and the receiver 22 attempt to synchronize on one clock, an analog front end (AFE) or network link clock 26 having a clock signal R1. Although theoretically sound, those skilled in the art will recognize that the network link clock is simply not a viable solution for a high speed modem as jitter and wander still degrade the clock signal preventing accurate synchronization.

It is good practice to separate the network link clock that governs the transmission of data between the transmitter and the receiver from the master clock that governs the data generation source. In this way the quality of transmission within the network link 24 can be designed independently of the quality of the master clock. The difficulty inherent in this separation of clock domains is that the master clock has to be faithfully reconstructed at the receiver side to provide correctly timed, synchronous output data.

Timing recovery is therefore required at the receiver side. In timing recovery, a receiver synchronizes a local clock with a master clock present at the transmitter via phase information contained directly or indirectly in the transmitted data stream. The data modulation and demodulation process that carries the data information over the link 24 may also necessitate the two sides to use a common network link clock if the link 24 is a synchronous communication link. Receicer synchronization to the network link clock is well understood to the skilled in the art and is not going to be described here.

Figure 2:
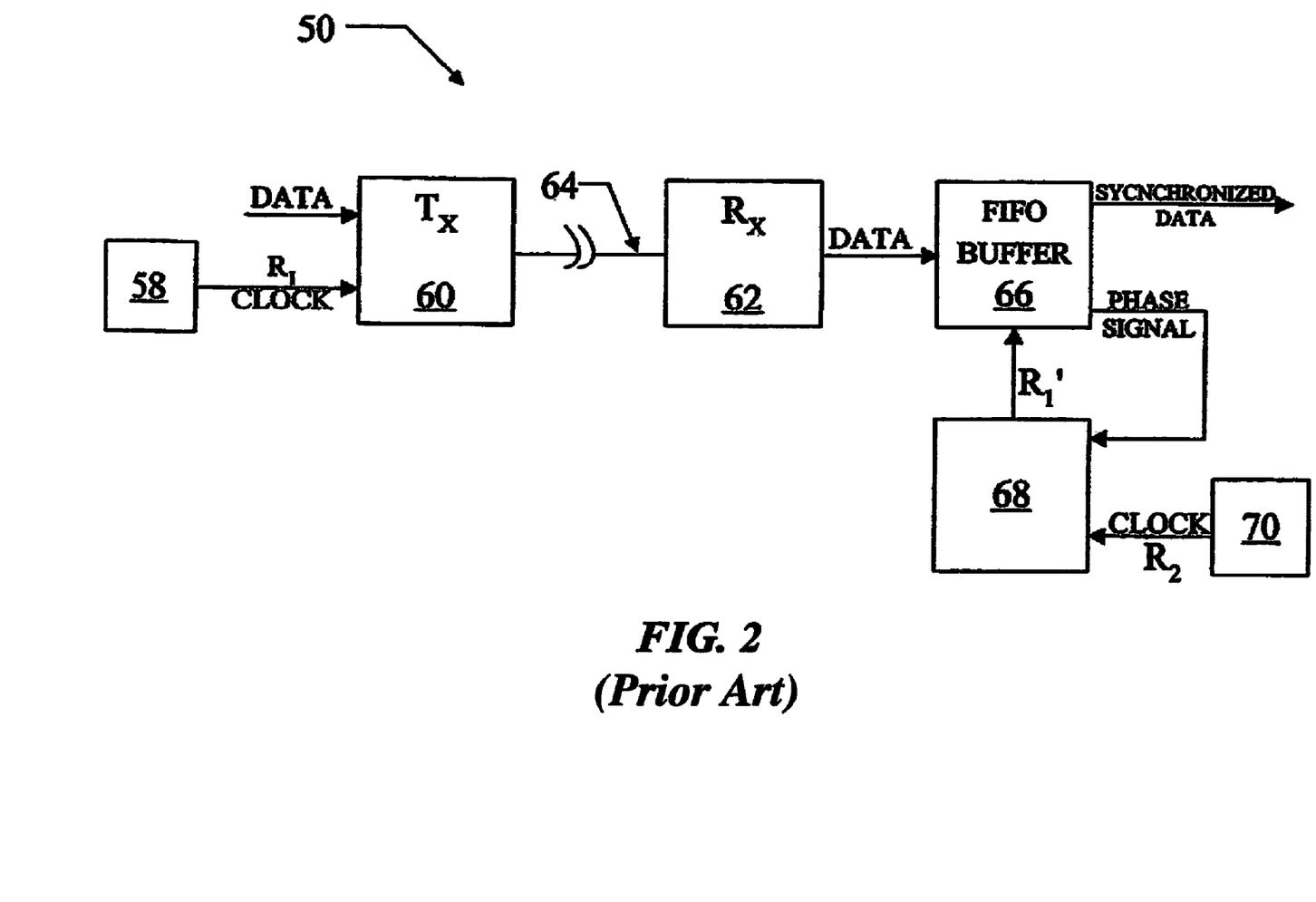
FIG. 2 illustrates another communication system of the prior art.

FIG. 2 is a block diagram of a communications system 50 implementing timing recovery of the master clock according to prior art. As will be described below, the communications system 50 recovers timing directly from the received data. The communication system 50 includes a master clock 58, a transmitter 60, a receiver 62, a network 64 bi-directionally coupling the transmitter 60 and the receiver 62, a First In First Out (FIFO) buffer 66, a control circuit 68, and a receiver clock 70. The receiver clock 70 is selected having a rate R2 known to be substantially equivalent to but slightly greater than R1, for reasons explained below.

The transmitter 60 transmits data via the network 64 at a rate R1 provided by the master clock 58 resident at the transmitter, or transported through the transmitter sourced by other network master transmitters. Data received at the receiver 62 is provided to and synchronized out through the FIFO buffer 66 at a recovered rate R1', which is an estimate of the transmitter rate R1. The rate R1' is obtained by the communications system 10 as follows. The FIFO buffer 66, synchronizing the data through the buffer clocked by the signal R1', generates a signal indicative of the available buffer capacity. Available buffer capacity is indicative of the phase error between R1 and R1' in that the FIFO buffer 66 filling up indicates that R1' is slower than R1, and vice versa. The control circuit 68 operates on its inputs R2 and the FIFO buffer 66 error signal to generate the recovered signal R1'.

Unfortunately, the communications system 50 of FIG. 2 suffers in that a wander error will only be corrected once sufficient information is extracted from the data, which means the receiver clock can wander quite sometime before being corrected. Jitter may simply not be corrected.

What is needed is a timing generation and recovery scheme with sufficient precision to support a high-speed modem communication system.

SUMMARY OF THE INVENTION

The present invention teaches a variety of timing generation and recovery schemes for providing high precision clock synchronization in cascaded communications systems where each point of communication has a unique clock. To accomplish the high precision, one embodiment of the present invention teaches quantizing information related to phase relation between a master clock at the transmitter and a network link clock. This quantized phase information can be transmitted with very little bandwidth, recovered and the receiver and used to recover the timing information with high precision.

BRIEF DESCRIPTION OF DRAWINGS

These and other objects, features and characteristics of the present invention will become more apparent to those skilled in the art from a study of the following detailed description in conjunction with the appended claims and drawings, all of which form a part of this specification. In the drawings:

DETAILED DESCRIPTION OF THE INVENTION

The present invention teaches a variety of timing generation and recovery schemes for providing high precision clock synchronization in cascaded communications systems where each point of communication has a unique clock. To accomplish the high precision, one embodiment of the present invention teaches quantizing information related to phase relation between a master clock at the transmitter and a network link clock. This quantized phase information can be transmitted with very little bandwidth, recovered at the receiver and used to recover the timing information with high precision.

Figure 3:
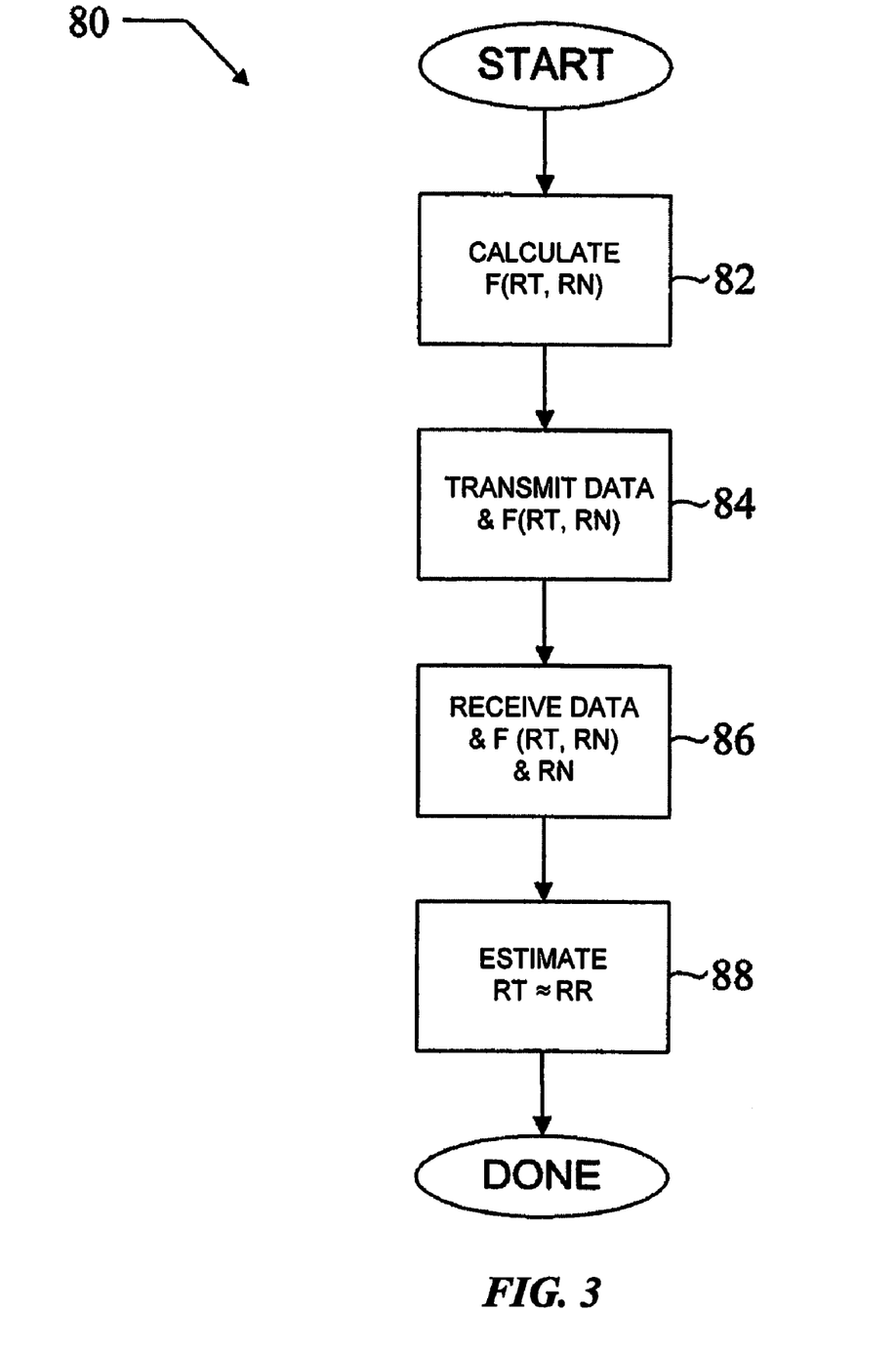
FIG. 3 is a flow chart of a timing generation and recovery method in accordance with one embodiment of the present invention.
Figure 4:
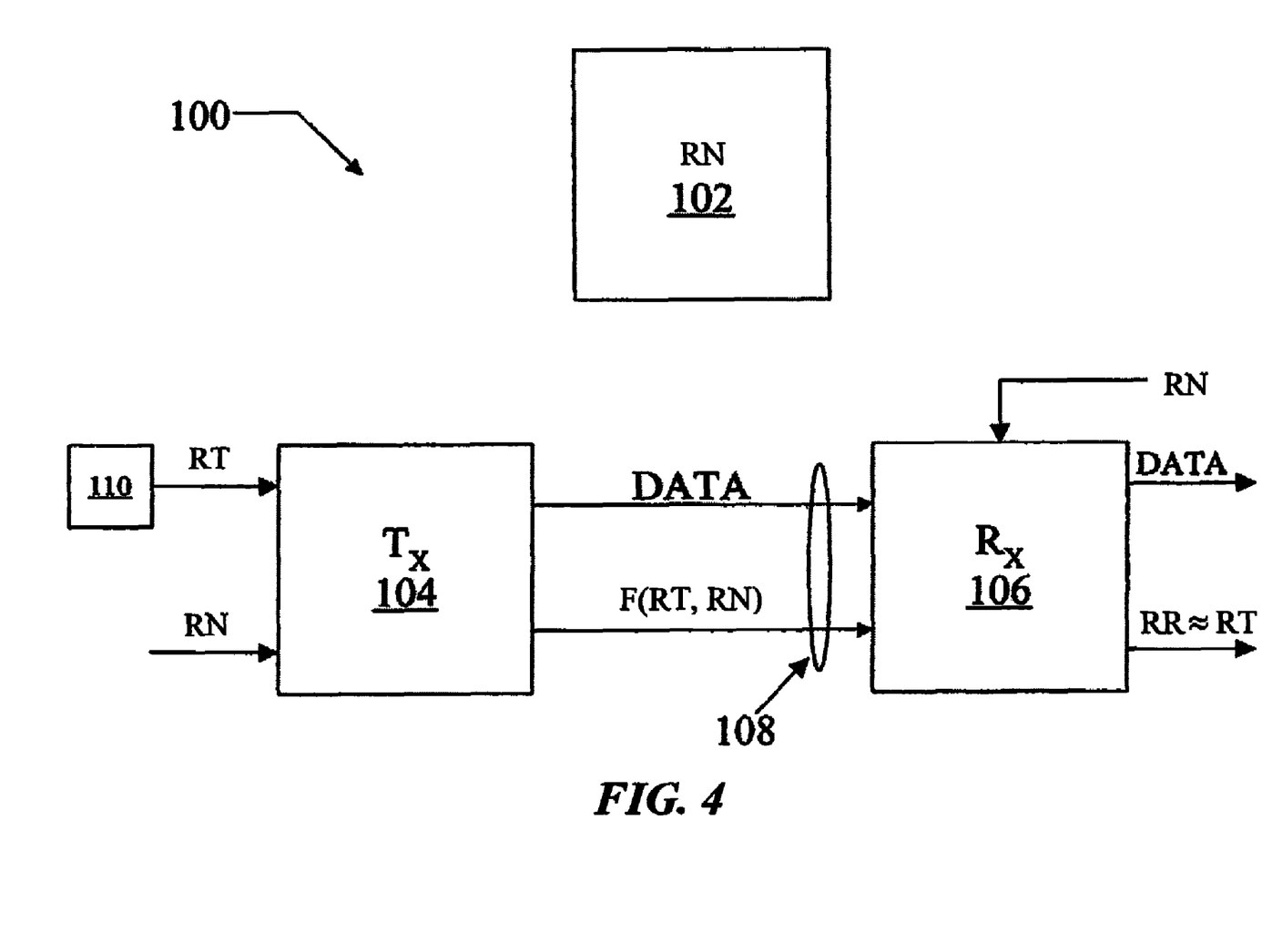
FIG. 4 is a block diagram of a communication system in accordance with one embodiment of the present invention.

A first embodiment of the present invention will now be described with reference to FIG. 3 and FIG. 4. FIG. 3 is a flow chart of a timing generation and recovery method 80 in accordance with one embodiment of the present invention. FIG. 4 illustrates a block diagram of a communications system 100 in accordance with another embodiment of the present invention. The communications system 100 includes a network link clock 102 generating a network link clock signal RN, a transmitter 104, a receiver 106, a network 108 coupling the transmitter 104 and the receiver 106, and a master clock 110 generating a master clock signal RT. The network 108 may be a cable system, or any other suitable network.

In FIG. 3, the method 80 begins at a master modem such as that present at a central office (CO) etc. where data, a master clock signal RT and a network link clock signal RN are provided to a transmitter. In a step 82, the transmitter 104 calculates a phase relation as a function f(RT, RN) between the master clock signal RT and the network link clock signal RN. The phase relation provides condensed information regarding the phase error between the two clock signals RT and RN. In preferred embodiments the function f(RT, RN) quantizes the phase information.

In a step 84, the transmitter 104 sends downstream data at a rate specified by the master clock signal RT, as well as transmitting the quantized phase signal. In certain embodiments, the quantized phase signal is transmitted via an overhead channel and takes minimal bandwidth relative to the data. In a step 86, a receiver 106 receives the downstream data together with the phase signal, as well as the network link clock signal RN. In a step 88, the receiver 106 recovers an estimate RT' of the master clock signal RT from the network link clock signal RN and the received phase signal.

As will be appreciated, the embodiment described above with reference to FIGS. 3 and 4 presents a scheme at a relatively high level of abstraction. To further explain the present invention, the next several FIGS. provide some specific examples that are well suited for use in a wireline or wireless modem system.

Figure 5:
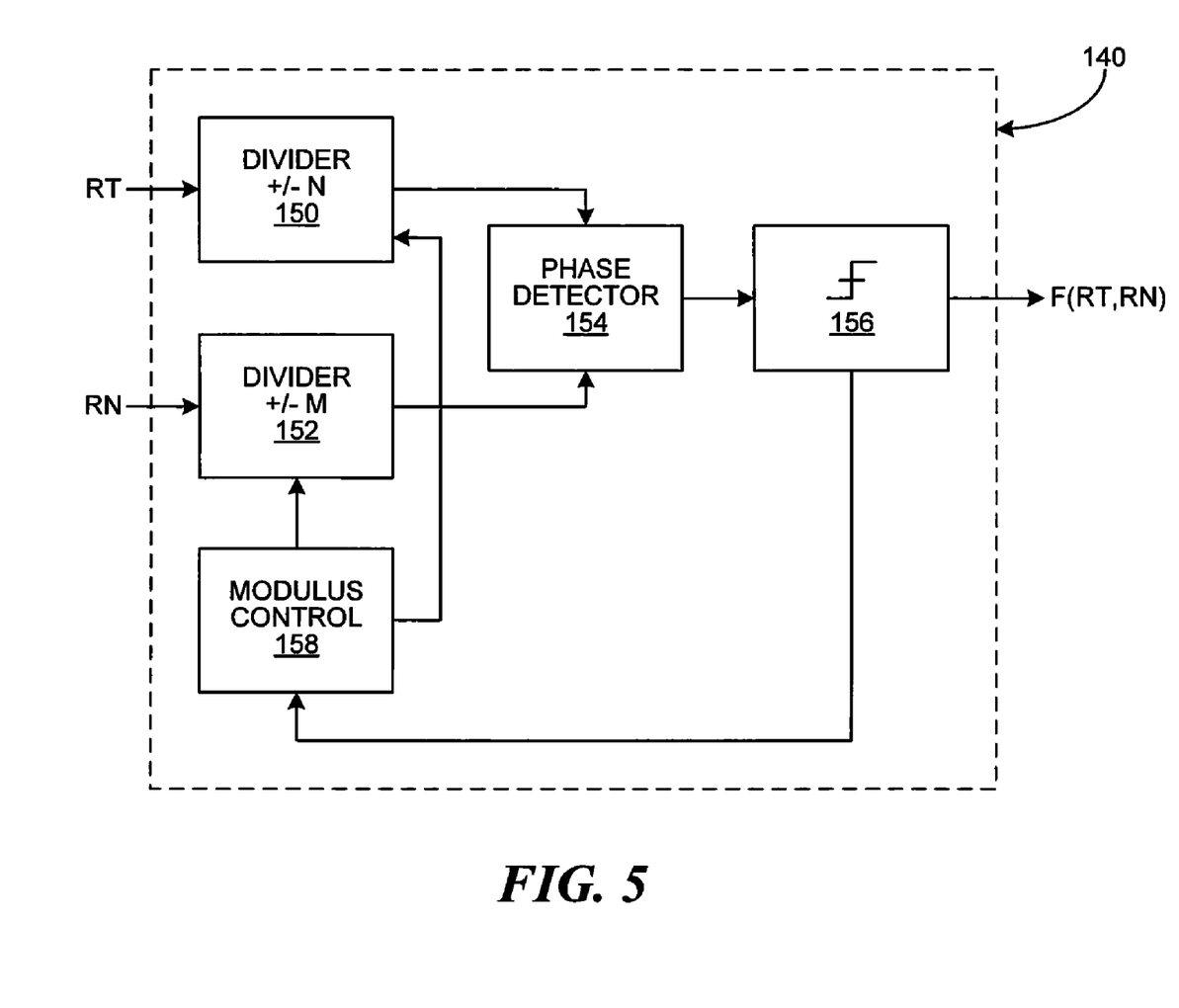
FIG. 5 is a block diagram of a timing generation circuit in accordance with another embodiment of the present invention.

FIG. 5 illustrates a block diagram of one suitable circuit for implementing a timing generation circuit 140 suitable within the transceiver 104 described above with reference to FIGS. 3-4. As will be appreciated, the timing generation circuit 140 can be useful in a variety of applications.

In communication system of FIG. 5, the network link clock signal RN and the master clock signal RT are well defined with respect to each other. The transmitter 104 includes a variable divider circuit 150, a variable divider circuit 152, a detector circuit 154, a quantizer circuit 156, and a modulus control circuit 158. The variable divider 150 and the variable divider 152 are each controllable to divide the frequency of their input signal by an integer adjustable by arbitrary integer offsets +/−N and +/−M, respectively. This division process enables each divider to generate a reference signal with a common nominal rate. Those dividers are necessary whenever the two clock frequencies RN and RT are not equal but are rationally related. Additionally, the phase difference between the two signals controls the frequency dividers 150 and 152 via the modulus control block 158. The detector 154 receives and measures a phase relation between the two reference signals RN and RT. The measured phase relation is fed into the quantizer circuit 156 that in turn generates the output signal f(RT, RN). The quantizer circuit 156 also provides an output signal for driving the modulus control circuit 158. The modulus control circuit 158 provides output signals controlling the quantities +/−N, +/−M variation for the divider circuits 150, 152, respectively.

Figure 6:
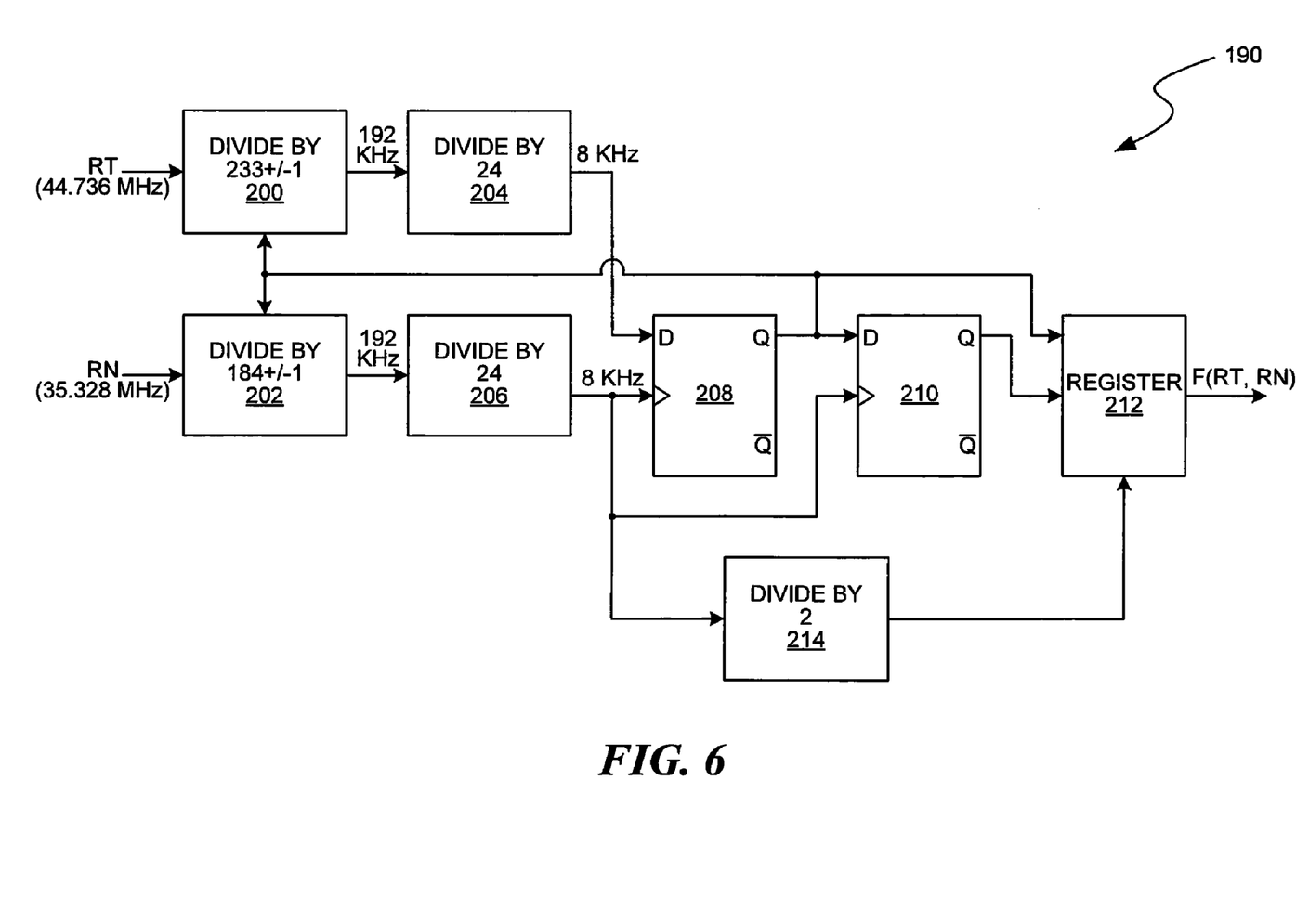
FIG. 6 is a block diagram of another timing generation circuit in accordance yet another embodiment of the present invention.

FIG. 6 shows a specific embodiment of a timing generation circuit 190. The timing generation circuit 190 is for a communications system using a master clock signal RT having a frequency rate of 44.736 MHz and a network link clock signal RN having a frequency rate of 35.328 MHz. As will be appreciated, these are arbitrary but familiar and common frequencies for circuitry. For example, 44.736 MHz is the transmission rate of DS3 systems used in telephony as part of the Synchronous Digital Hierarchy (SDH) system. The timing generation circuit 190 includes two variable modulus counters 200 and 202 used as variable dividers, two divider circuits 204 and 206, two D-flip-flops 208 and 210 operating as the detector, a register 212, and a divider circuit 214. In this specific embodiment, the variable divider offsets +/−M and +/−N are both equal to +/−1.

Operation of the timing generation circuit 190 is as follows. The master clock signal RT is divided by the nominal value 233 at the variable modulus counter 200 to generate a 192 kHz reference. Similarly, the network link clock signal RN is divided by the nominal value 184 at the variable modulus counter 202 to generate a 192 kHz reference. Both reference signals are further divided by 24 to a nominal rate of 8 kHz. Both dividers are able to change their nominal dividing value by +/−1.

The D-flip-flops are used to measure the phase relationship between the master clock signal RT and the network link clock signal, brought down to a nominal rate of 8 kHz. If the D-flip-flop output is a "1" then "phase" is deleted by varying the modulus of the counter 202 to 183 and the modulus of the counter 200 to 232 simultaneously for one detector reference clock at 8 kHz. Changing the phase simultaneously results in a phase change relative to the master clock RT of:

$$((1/184)-(1/133))*233=0.261$$

unit intervals (UI) of the RT clock. This phase change of approximately 0.25 UI is four times better than if one simply changed only the master clock signal RT modulus. By performing this phase adjustment every 8 kHz, the maximum parts per million (PPM) that can be tracked is:

$$2*(0.261*8000*1,000)/(44.736*1,000,000)+/-$$
$$46.6738 \text{ PPM}.$$

The phase comparisons are made every 8 kHz. The quantized phase relation is transmitted through an overhead channel every 4 kHz (once per frame) and requires a minimum of 2-bits per frame with no redundancy.

Having explained the operation of the transmitter according to the teachings of the invention, we now proceed to explain the operation of the receiver.

Figure 7:
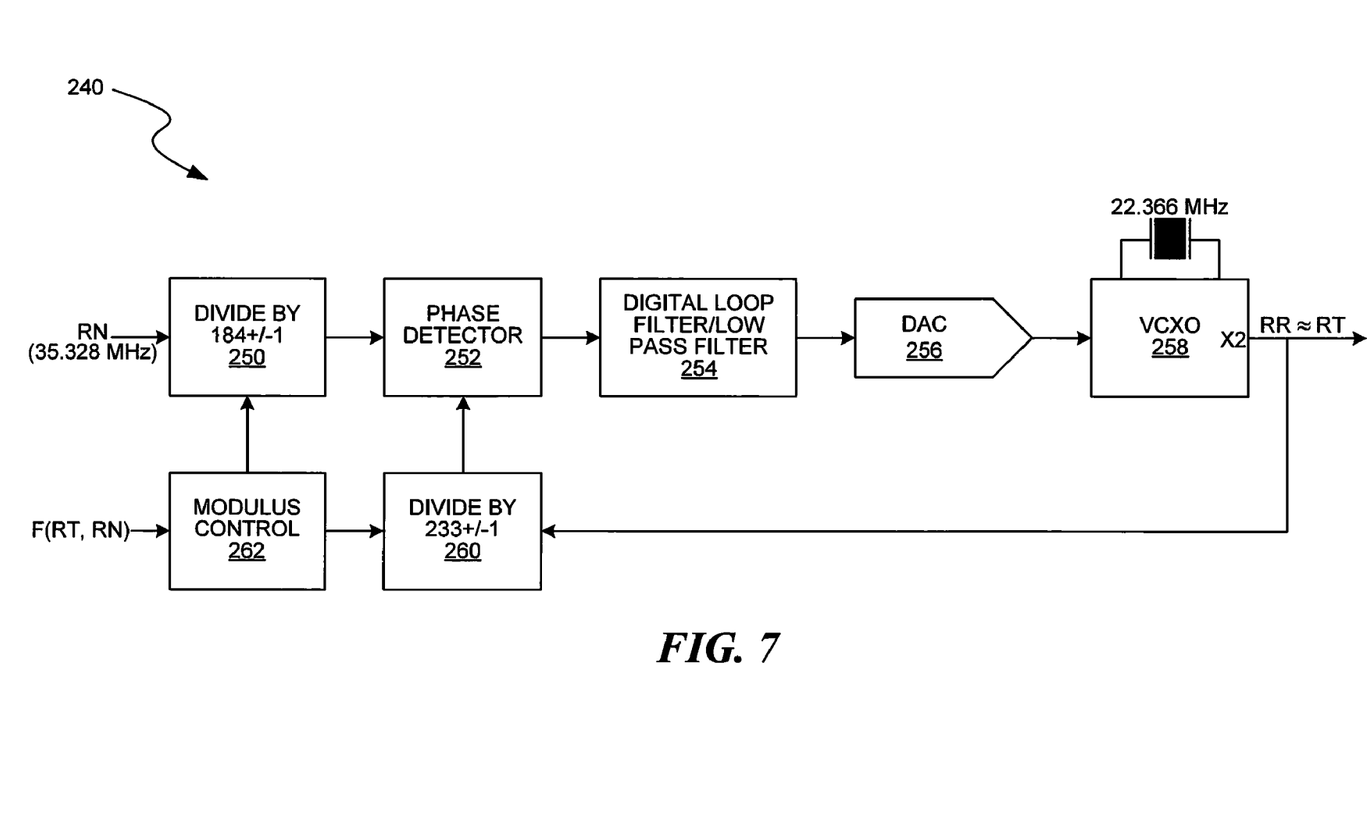
FIG. 7 is a block diagram of a timing recovery circuit according to one aspect of the present invention.

FIG. 7 illustrates a block diagram of one specific embodiment of a phase locked looped timing recovery circuit 240. The timing recovery circuit is well suited for use in a communications system using a master clock signal RT having a frequency rate of 44.736 MHz and a network link clock signal RN having a frequency rate of 35.328 MHz. As will be appreciated, both the timing generation circuit 190 and the timing recovery circuit 240 are required in the present invention.

The timing recovery circuit 240 includes a variable modulus counter 250, a detector circuit 252, a digital loop filter 254, a digital-to-analog converter (DAC) 256, a voltage controlled oscillator 258, a variable modulus counter 260, and a modulus control circuit 262. The network link clock signal RN is divided by 184+/−1 at the counter 250 to generate a 192 kHz reference. The estimate of RT, RR, is divided by 233+/−1 at the counter 260, to generate a 192 kHz reference. The phase relation is recovered by the receiver modem using the overhead channel information via circuitry not illustrated and provided to the modulus control circuit 262. The modulus control circuit 262 controls both variable modulus counters 250 and 262 according to the phase difference provided via the overhead channel. The detector 252 measures the phase relationship between RR and RN. The digital loop filter 254 is a lowpass filter, and the oscillator 258 generates RR according to a voltage provided by the DAC 256.

The circuit of FIG. 7 recovers the network link clock RN through the following process: After an initial acquisition period, the timing loop will reach a steady state where the output clock frequency RR matches the transmitter frequency RT. Then the modulus circuitry comprising of 250, 252, 260 and 262 will re-create the phase variations of RN around the reconstructed clock RT by way of repeating the process followed at the transmitter (FIG. 5).

Next we present a further enhancement of the current invention that allows even finer phase granularity in the clock tracking system.

Figure 8:
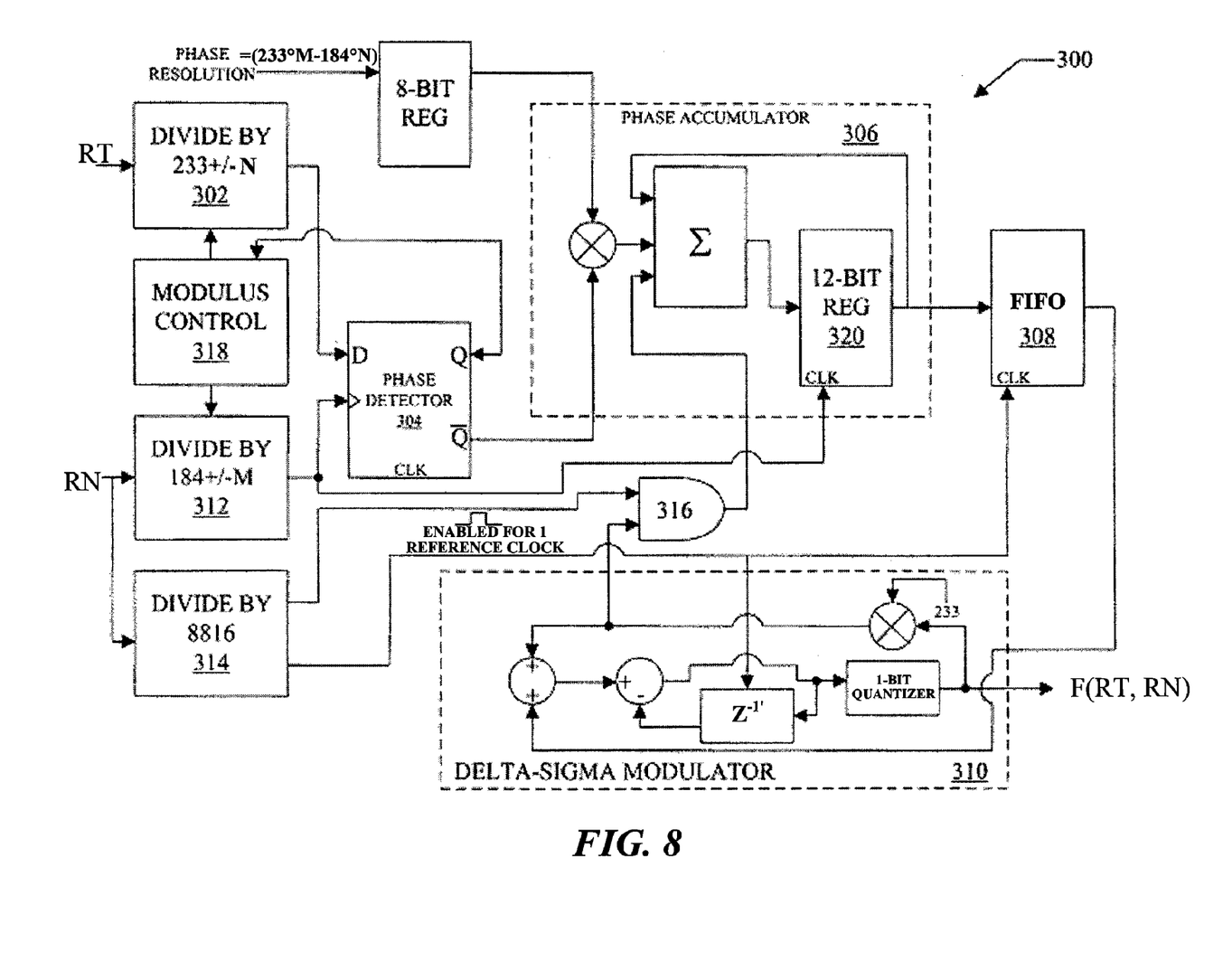
FIG. 8 is a block diagram of a higher precision timing generation circuit in accordance with an embodiment of the present invention.

FIG. 8 illustrates a block diagram of a timing generation circuit 300 capable of providing finer precision than the timing generation circuit 190 of FIG. 6. The timing generation circuit 300 includes a variable modulus counter 302, a detector 304 (a D-flip-flop), a phase accumulator circuit 306, a FIFO 308, a delta-sigma modulator circuit 310, a variable modulus counter 312, a divider circuit 314, a gate 316, and a modulus control circuit 318. The variable modulus counter 302 and the variable modulus counter 312 are each operable to vary by +/−N and +/−M from their nominal divide value respectively for each reference period. By properly selecting the integers M and N, the phase relationship between the references can be adjusted with fine precision.

A D-flip-flop acting as the detector 304 continually measures the phase between the master clock and the network link clock references. Any positive phase output, i.e. logic "1" from the detector 304, results in "phase" being deleted for the next reference period by changing the network link clock modulus by −M and the master clock modulus by −N. Any negative phase output, i.e. logic "0" from the detector 304, results in "phase" being added to the next reference period by changing the network link clock modulus by +M and the master clock modulus by +N.

Each time a phase adjustment is made the amount of phase that is added or deleted relative to the network link clock can be calculated as Phase Adjustment=(233*M−184*N)/233=Phase Resolution/233.

Thus when the sum of the phase accumulator 306 register 320 reaches a count of +/−233, then a single network link clock is added or deleted. The inverted output of the detector 304 is used to multiply the phase resolution value since for positive detector outputs phase is deleted. The logic "0" output is arithmetically interpreted as −1.

The output of the phase accumulator 306 is examined at the frame rate 4 kHz or once per frame. Prior to transmission, the phase accumulator 306 is processed by the first order delta-sigma modulator 310. It will be appreciated that higher order modulator schemes may be used. The modulator 310 helps reduce low frequency wander by pushing the low frequency wander components into the higher frequency bands, which could then be filtered by the receiving clock tracking circuitry. The modulator 310 operates at the frame rate 4 kHz. When the 1-bit output is high, a value 233 is added to the phase accumulator register 320 for a single reference period. This occurs since the logic '1' output indicates that a single network link clock has been deleted. The average value of the 1 bit modulator 310 output represents the amount of phase added or deleted over a 4 kHz frame.

The block diagram of FIG. 8 explains the required operations on the transmitter side in this enhanced embodiment of the invention. The operations on the receiver side are similar to the ones explained before based on the block diagram of FIG. 7. The difference in this embodiment is that the RN divider 260 is fixed to its nominal value 184, while only the divider 260 is allowed to vary around its nominal value of 233 by +/−1.

Allowing for the addition/deletion of a single network link clock every 4 kHz results in the ability of handling phase precision of +/−80 PPM. Recommended values are M=4, N=5, and phase resolution=12.

In addition to the above mentioned examples, various other modifications and alterations of the invention may be made without departing from the invention. Accordingly, the above disclosure is not to be considered as limiting and the appended claims are to be interpreted as encompassing the true spirit and the entire scope of the invention.

The invention claimed is:

1. A communication system for providing communications between a first location and a second location, the communication system comprising:
   a transmitter module at the first location associated with a first clock,
   the transmitter module comprising a phase detector module operable to generate a one or more data bits to indicate phase offset-between the first clock and a second clock, the first clock to be to be associated with a transmission rate and the second clock to be associated with a network link rate;
   wherein the transmitter module further comprises:
      a timing generation circuit comprising:
         a divider circuit;
         a quantizer circuit coupled to the phase detector module; and
         a modulus control circuit coupled to the quantizer circuit;
   a receiver module at the second location associated with the second clock, the receiver module to be coupled to the transmitter module via a network;

wherein the transmitter module is operable to transmit to the receiver module at least one of a data stream and the one or more data bits to indicate phase offset via the network; and wherein the receiver module is operable to determine the transmission rate associated with the first clock at the first location based on the one or more data bits to indicate phase offset and the network link rate.

2. The communication system of claim 1, wherein the first clock and the second clock have a predefined relation, and the phase detector module is operable to generate signals from the first and the second clocks, the signals having a nominal frequency rate rendering phase comparison of the first and the second clocks possible.

3. The communication system of claim 1, wherein the transmitter module is operable to transmit the one or more data bits to indicate phase offset.

4. The communication system of claim 3, wherein the phase offset is transmitted in an overhead channel.

5. The communication system of claim 1, wherein the divider circuit comprises a variable modulus counter.

6. The communication system of claim 1, wherein the phase detector module comprises one or more D flip-flops.

7. The communication system of claim 6, further comprising, a register coupled to the one or more D flip-flops.

8. The communication system of claim 1, wherein the receiver module comprises a timing recovery circuit.

9. The communication system of claim 8, wherein the timing recovery circuit further comprises a variable modulus counter.

10. The communication system of claim 9, wherein the timing recovery circuit further comprises a digital loop filter.

11. The communication system of claim 10, wherein the timing recovery circuit further comprises one or more of a digital-to-analog converter and a voltage controlled oscillator.

12. A communication system for providing communications between a first location and a second location, the communication system comprising:
 a transmitter module at the first location associated with a first clock,
 the transmitter module comprising a phase detector module operable to generate a one or more data bits to indicate phase offset—between the first clock and a second clock, the first clock to be to be associated with a transmission rate and the second clock to be associated with a network link rate;
 wherein the transmitter module further comprises:
  a timing generation circuit comprising
  a phase accumulator;
 a receiver module at the second location associated with the second clock, the receiver module to be coupled to the transmitter module via a network;
 wherein the transmitter module is operable to transmit to the receiver module at least one of a data stream and the one or more data bits to indicate phase offset via the network; and
 wherein the receiver module is operable to determine the transmission rate associated with the first clock at the first location based on the one or more data bits to indicate phase offset and the network link rate.

13. The communication system of claim 12, wherein, the receiver module comprises a timing recovery circuit.

14. The communication system of claim 13, wherein, the timing recovery circuit comprises a variable modulus counter.

15. The communication system of claim 13, wherein the timing recovery circuit comprises a digital loop filter.

16. The communication system of claim 13, wherein the timing recovery circuit further comprises, one or more of a digital to analog converter and a voltage controlled oscillator.

17. A communication system for providing communications between a first location and a second location, the communication system comprising:
 a transmitter module at the first location associated with a first clock,
 the transmitter module comprising a phase detector module operable to generate a one or more data bits to indicate phase offset-between the first clock and a second clock, the first clock to be to be associated with a transmission rate and the second clock to be associated with a network link rate;
 wherein the transmitter module further comprises:
  a timing generation circuit comprising
  a delta-sigma modulator;
 a receiver module at the second location associated with the second clock, the receiver module to be coupled to the transmitter module via a network;
 wherein the transmitter module is operable to transmit to the receiver module at least one of a data stream and the one or more data bits to indicate phase offset via the network; and
 wherein the receiver module is operable to determine the transmission rate associated with the first clock at the first location based on the one or more data bits to indicate phase offset and the network link rate.

18. The communication system of claim 17, wherein, the receiver module comprises a timing recovery circuit.

* * * * *